United States Patent
Kim et al.

(10) Patent No.: US 7,266,031 B2
(45) Date of Patent: Sep. 4, 2007

(54) INTERNAL VOLTAGE GENERATOR WITH TEMPERATURE CONTROL

(75) Inventors: Jung Pill Kim, Cary, NC (US);
Jong-Hoon Oh, Chapel Hill, NC (US);
Stephen Bowyer, Raleigh, NC (US);
George Alexander, Durham, NC (US)

(73) Assignee: Infineon Technologies AG, Munich (DE)

( * ) Notice: Subject to any disclaimer, the term of this patent is extended or adjusted under 35 U.S.C. 154(b) by 224 days.

(21) Appl. No.: 10/716,749

(22) Filed: Nov. 19, 2003

(65) Prior Publication Data

US 2005/0105367 A1    May 19, 2005

(51) Int. Cl.
*G11C 7/04*    (2006.01)
*G11C 7/00*    (2006.01)

(52) U.S. Cl. ................. 365/211; 365/189.09; 365/226; 365/230.06

(58) Field of Classification Search ................ 365/211, 365/222, 226, 227, 189.09, 189.12, 230.06
See application file for complete search history.

(56) References Cited

U.S. PATENT DOCUMENTS

| | | | |
|---|---|---|---|
| 5,276,843 A * | 1/1994 | Tillinghast et al. ......... | 365/211 |
| 5,440,520 A * | 8/1995 | Schutz et al. ............... | 365/226 |
| 5,608,347 A | 3/1997 | Kearney | |
| 6,002,627 A | 12/1999 | Chevallier | |
| 6,005,434 A | 12/1999 | Tsukikawa et al. | |
| 6,084,812 A * | 7/2000 | Joo ............................ | 365/222 |
| 6,205,074 B1 | 3/2001 | Van Buskirk et al. | |
| 6,343,044 B1 | 1/2002 | Hsu et al. | |
| 6,456,555 B2 * | 9/2002 | Sim et al. ................... | 365/226 |
| 6,738,297 B2 | 5/2004 | Di Iorio | |
| 6,768,693 B2 * | 7/2004 | Feurle et al. ............... | 365/222 |
| 6,778,453 B2 * | 8/2004 | Cooper et al. .............. | 365/211 |
| 6,781,907 B2 * | 8/2004 | Marr .......................... | 365/211 |
| 6,809,978 B2 * | 10/2004 | Alexander et al. .......... | 365/211 |
| 6,829,190 B1 * | 12/2004 | Snyder et al. .............. | 365/211 |
| 6,903,994 B1 * | 6/2005 | Schoenfeld ................. | 365/227 |
| 6,958,947 B2 * | 10/2005 | Park et al. .................. | 365/226 |
| 2005/0104566 A1 | 5/2005 | Kim | |

OTHER PUBLICATIONS

PCT International Search Report and PCT Written Opinion dated May 12, 2005.

* cited by examiner

*Primary Examiner*—Trong Phan
(74) *Attorney, Agent, or Firm*—Patterson & Sheridan, L.L.P.

(57) ABSTRACT

Methods and apparatus for varying one or more internally generated voltages of a memory device based on the temperature of the memory device are provided. The device temperature may be measured directly, for example, via an on-chip temperature sensor, or may be supplied as bits in a mode register containing temperature information.

21 Claims, 8 Drawing Sheets

INTERNAL VOLTAGE GENERATOR WITH TEMPERATURE CONTROL

CROSS-REFERENCE TO RELATED APPLICATIONS

The present invention is related to the commonly owned, co-pending U.S. patent application entitled "Back-Bias Voltage Generator With Temperature Control," filed on Nov. 19, 2003, application Ser. No. 10/716.762.

BACKGROUND OF THE INVENTION

1. Field of the Invention

The present invention generally relates to integrated circuit devices that generate voltages internally and, more particularly, to memory devices that rely on a variety of internally generated voltages that may be varied with temperature to improve their performance.

2. Description of the Related Art

In recent years, the demands for low-power and low-voltage memory have increased tremendously as portable and handheld devices, such as personal digital assistants (PDAs), cellular phones, and notebook computers have become increasingly popular. Simply put, the less power these devices consume, the longer they may operate off of their batteries and/or the size and weight of their batteries may be reduced, enhancing portability in either case.

One of the more popular types of memory used in these devices, due to the available density, speed, and relatively low cost, is dynamic random access memory (DRAM). DRAM devices are referred to as dynamic (as opposed to static) because their memory cells must be refreshed periodically (within a given retention time) in order to maintain data stored therein. Typically, a DRAM device can be placed in a self-refresh mode, whereby the DRAM devices generates signals internally (i.e., self-refresh signals) to refresh each row of memory cells. DRAM devices are typically put into a self-refresh mode when a system is placed in a standby or low power mode, which may be entered quite aggressively in order to conserver power in portable devices.

As a result, one of the main contributing factors to power consumption in DRAM devices is self-refresh current generated during standby modes. Accordingly, reducing self-refresh current is one of the most important challenges in low-power and low-voltage DRAM design (or any other types of memory that require refresh, such as PSRAM). The self-refresh current consists of current consumed by switching transistors in memory cell arrays and peripheral circuitry, as well as DC current. The DC current is typically caused by the flow of current through a transistor while in the off state (i.e., the switching voltage of the transistor $V_{GS}$ is below the threshold voltage $V_{TH}$), generally referred to as subthreshold leakage current. In the past, the DC current contribution was generally small and array current was the larger factor in the self-refresh current. However, as memory density increases, the number of transistors increases accordingly, such that DC current due to subthreshold leakage current increases drastically. Thus, to produce a low power memory device, reducing subthreshold leakage current is highly desirable.

Subthreshold leakage current depends on channel width and length, threshold voltage, gate-source voltage, and drain-source voltage of the transistors. Since the subthreshold voltage is a function of drain-source voltage, transistors using a boosted wordline voltage, commonly referred to as $V_{PP}$, consume more subthreshold leakage current. $V_{PP}$ is mainly used in row decoder circuits and is applied to the cell gate (via a wordline) to store high logic data. In order to compensate for the voltage drop of $V_{TH}$ across the cell switching transistor and ensure a full bit line high logic voltage level $V_{BLH}$ is transferred to the cell, $V_{PP}$ is typically set to a level one cell threshold voltage $V_{TH}$ above $V_{BLH}$.

Figure 1:
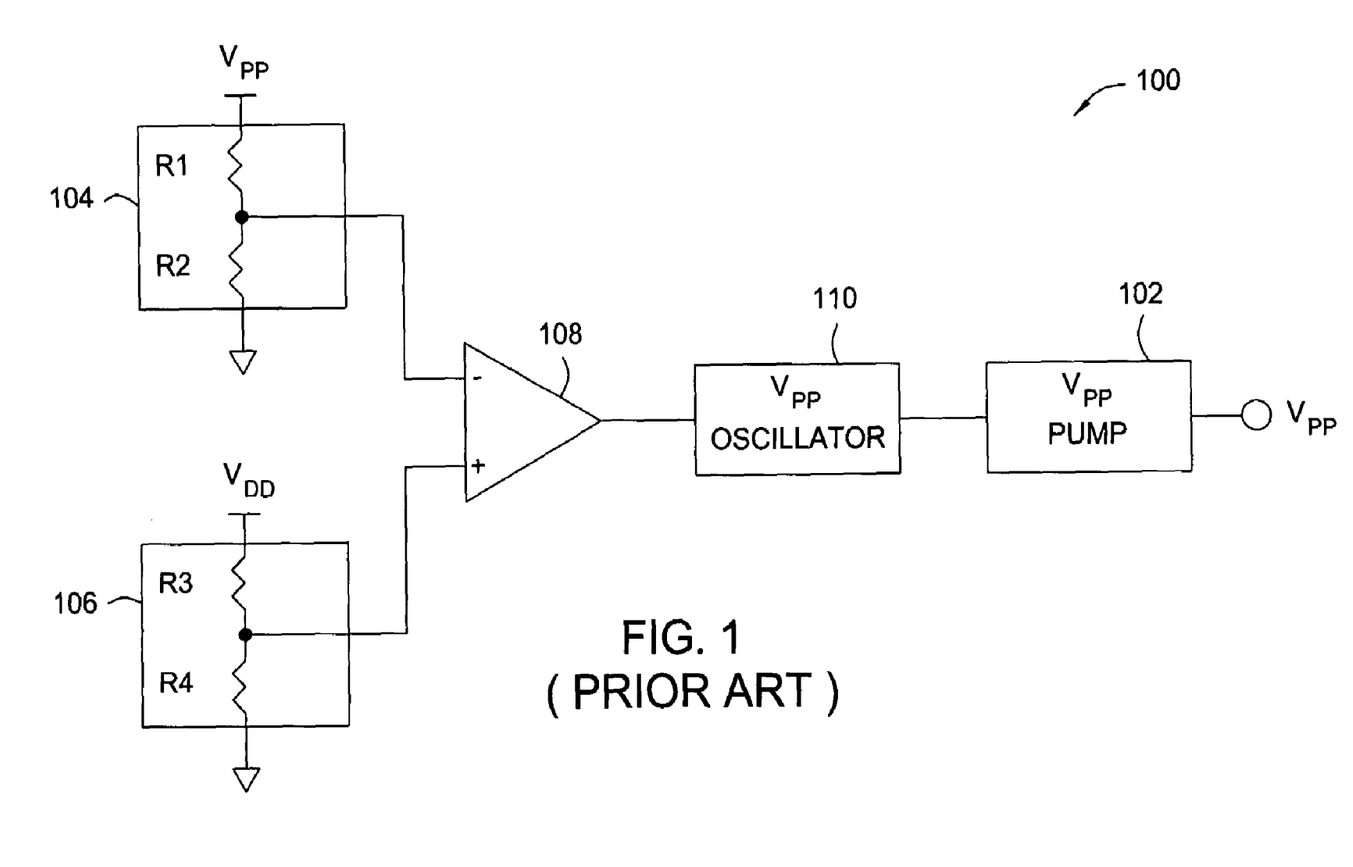
FIG. 1 illustrates an exemplary prior art voltage generator.

As $V_{PP}$ is outside the typical supply voltage range, memory devices typically include a voltage generator, including a charge pump, to generate $V_{PP}$. FIG. 1 illustrates an exemplary conventional $V_{PP}$ generator 100. In addition to a charge pump 102, the $V_{PP}$ generator 100 also includes a $V_{PP}$ detector 104, a $V_{PP}$ reference 106, a comparator 108, and a $V_{PP}$ oscillator 110. Generally speaking, the reference 106 sets the desired $V_{PP}$ level while detector 104 is configured to detect a minimum $V_{PP}$ level. As illustrated, both the detector 104 and reference 106 may be configured as simple voltage dividers using resistors R1-R4, chosen such that the output of the detector 104 matches the output of the reference 106 at the minimum $V_{PP}$ level. Accordingly, outputs from the reference and detector may be input to the comparator 108 such that, when the detected $V_{PP}$ level drops below the minimum $V_{PP}$ level set by the reference, the output of comparator 108 enables the $V_{PP}$ oscillator 110 which drives the pump 102 to restore the original target voltage level.

Utilizing this conventional $V_{PP}$ generator 100, $V_{PP}$ stays at substantially the same voltage level over a wide operating temperature range. As previously described, the target $V_{PP}$ level is typically chosen to be higher than the high bit line logic level ($V_{BLH}$) by the cell threshold voltage $V_{TH}$, which is highest at low temperatures. Accordingly, the target $V_{PP}$ level is typically set high enough to accommodate this worst case (maximum) cell threshold voltage. Unfortunately, this results in an unnecessarily high $V_{PP}$ level and increased subthreshold leakage current when the cell transistor threshold voltage is lower at higher temperatures.

Accordingly, there is a need for techniques and apparatus for improving device performance (e.g., reducing subthreshold leakage current or improving refresh times) in a memory device, preferably by varying one or more internally generated voltage levels based on the device temperature.

SUMMARY OF THE INVENTION

The present invention generally provides methods and apparatus for varying one or more internally generated voltages of a memory device based on the temperature of the memory device.

One embodiment provides a method of generating one or more voltages internally by a memory device. The method generally includes obtaining temperature information indicative of the temperature of the memory device and varying a level of one or more internally generated voltages based on the temperature information.

Another embodiment provides a method of reducing subthreshold current in memory cells of a memory device. The method generally includes generating, from a supply voltage, a boosted voltage greater than the supply voltage to be applied to a wordline of one or more of the memory cells during a memory cell access and varying the level of the boosted voltage based on temperature information indicative of a temperature of the memory device.

Another embodiment provides a memory device generally including peripheral circuitry, a plurality of memory cells, means for supplying temperature information indicative of a temperature of the memory device, and one or more voltage generators. The one or more voltage generators are generally configured to vary a level of a generated output voltage supplied to at least one of the peripheral circuitry and the memory cells, based on the temperature information.

Another embodiment provides a memory device generally including peripheral circuitry, a plurality of memory cells, means for supplying temperature information indicative of a temperature of the memory device, and a voltage generator. The voltage generator is generally configured to generate, from a supply voltage, a boosted voltage greater than the supply voltage and vary the level of the boosted voltage based on the temperature information.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

The present invention provides methods and apparatus for varying one or more voltages generated on a memory device based on device temperature. Device temperature may be measured directly, for example, via an on-board temperature sensor or may be provided as bits in a mode register containing externally supplied temperature information. In any case, in contrast to the prior art, internally generated voltages may be varied with temperature, thus improving device performance. As an example, the level of an internally generated boosted wordline voltage ($V_{PP}$) may be reduced with rising device temperature to reduce subthreshold leakage current. As another example, the level of an internally generated back bias voltage ($V_{BB}$) may be lowered with rising device temperature to increase cell threshold voltage and improve refresh time.

Memory devices, such as DRAMs, as well as other type devices, utilize a wide variety of internally generated voltages. One skilled in the art will recognize that the techniques described herein may be used to vary any of these internally generated voltages based on temperature in order to achieve a variety of different results. While any number of different generated voltage signals may be varied with temperature using the techniques described herein, to achieve various types of results, to facilitate understanding, certain embodiments will be described below with reference to varying $V_{PP}$ to reduce subthreshold leakage current as a particular and/or varying $V_{BB}$ to improve refresh time as specific, but not limiting, application examples.

An Exemplary Memory Device

Figure 2:
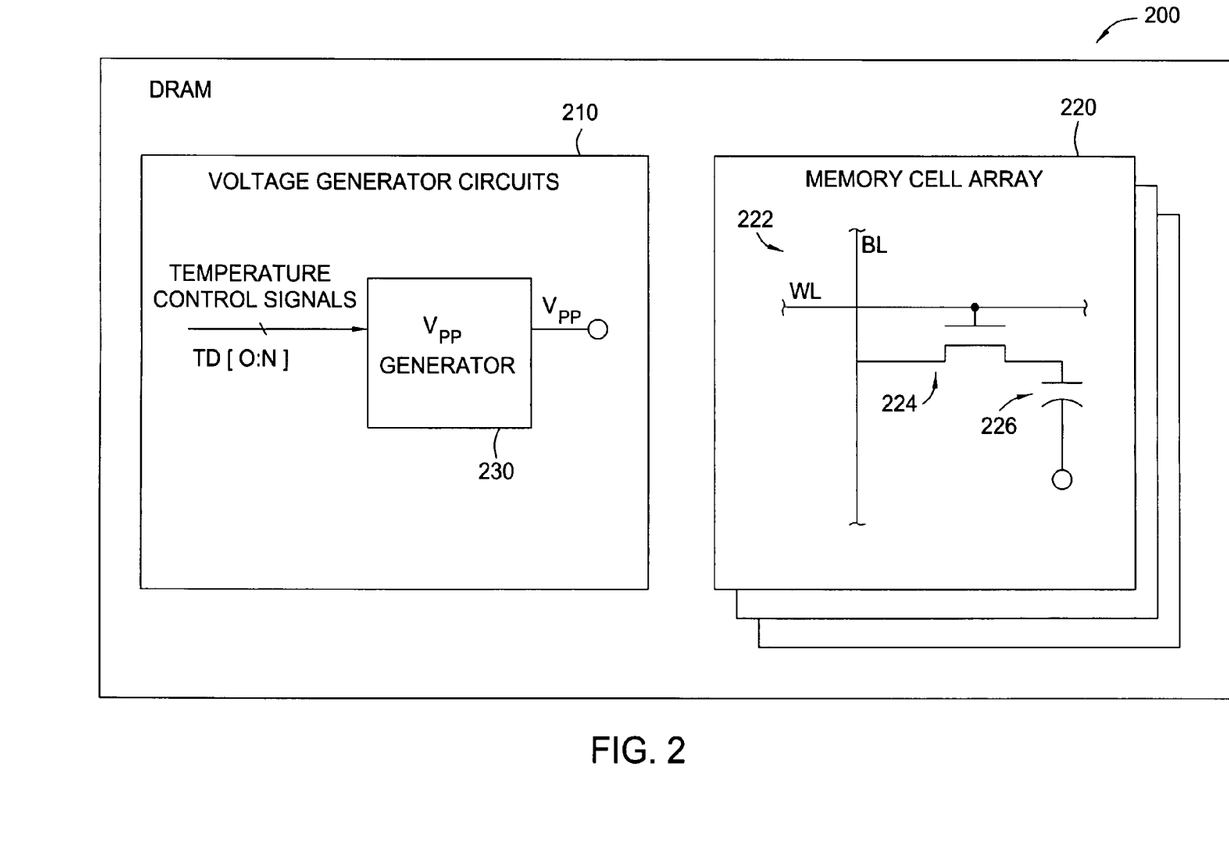
FIG. 2 illustrates an exemplary memory device with a temperature controlled voltage generator in accordance with one embodiment of the present invention.

FIG. 2 illustrates an exemplary DRAM device 200 having temperature controlled voltage generation circuits 210 and a plurality of memory cell arrays 220, in accordance with one embodiment of the present invention. The voltage generation circuits 210 may include various voltage generators for supplying voltages to peripheral circuitry of the DRAM device (e.g., self-refresh circuitry, bit-line sensing circuitry, and the like) and to the memory cells.

As illustrated, the voltage generation circuits 210 may include a generator 230 for generating a boosted wordline voltage ($V_{PP}$) to be applied to a wordline of a memory cell 222 during a memory cell access. As previously described, $V_{PP}$ may be set to a threshold voltage ($V_{TH}$) above a bit line logic high level ($V_{BLH}$) and may be applied to the gate of a switching transistor 224 via a wordline (WL), to write or read logic high data to or from a storage capacitor 226 of the memory cell 222.

In contrast to voltage generators of conventional DRAM devices which generate a substantially constant voltage over a wide range of temperatures, voltage generators in accordance with the present invention may vary the level of the voltage they generate based on temperature. For example, the $V_{PP}$ generator 230 may be configured to reduce the voltage level of $V_{PP}$ for rising temperatures of the device, which may compensate for reducing threshold voltage of the switching transistor 224 and reduce threshold leakage current.

For some embodiments, the $V_{PP}$ generator 230 may vary the level of $V_{PP}$ in response to one or more temperature control signals TD[0:N] indicative of temperature, which may be generated by various means. For example, as will be described in greater detail below, TD[0:N] may be generated based on externally supplied temperature information stored as bits in a mode register or by an internal temperature sensor (not shown). Of course, for different embodiments, the exact format of the temperature control signals may vary (e.g. a different number of bits, different combinations of bits represent different ranges, etc.).

For one embodiment, each one of the temperature control signals TD[0:N] may correspond to a distinct temperature range, with only one signal driven high at any given time. In other words, a different voltage level for $V_{PP}$ to be selected by driving a different one of the signals high when the device temperature is in the corresponding range. TABLE I below illustrates a set of exemplary temperature ranges that may be represented by four temperature control signals TD[0:3] (i.e., TD[0:N], with N=3). Of course, the temperature ranges shown in Table I are illustrative only, and any number of temperature ranges may be used, depending on the application.

TABLE I

Exemplary Temperature Ranges

| TD | Temperature Range |
|---|---|
| 0 | T > 75 C. |
| 1 | 75 C. > T > 50 |
| 2 | 50 C. > T > 25 |
| 3 | T < 25 |

An Exemplary Temperature Controlled $V_{PP}$ Generator

Figure 3:
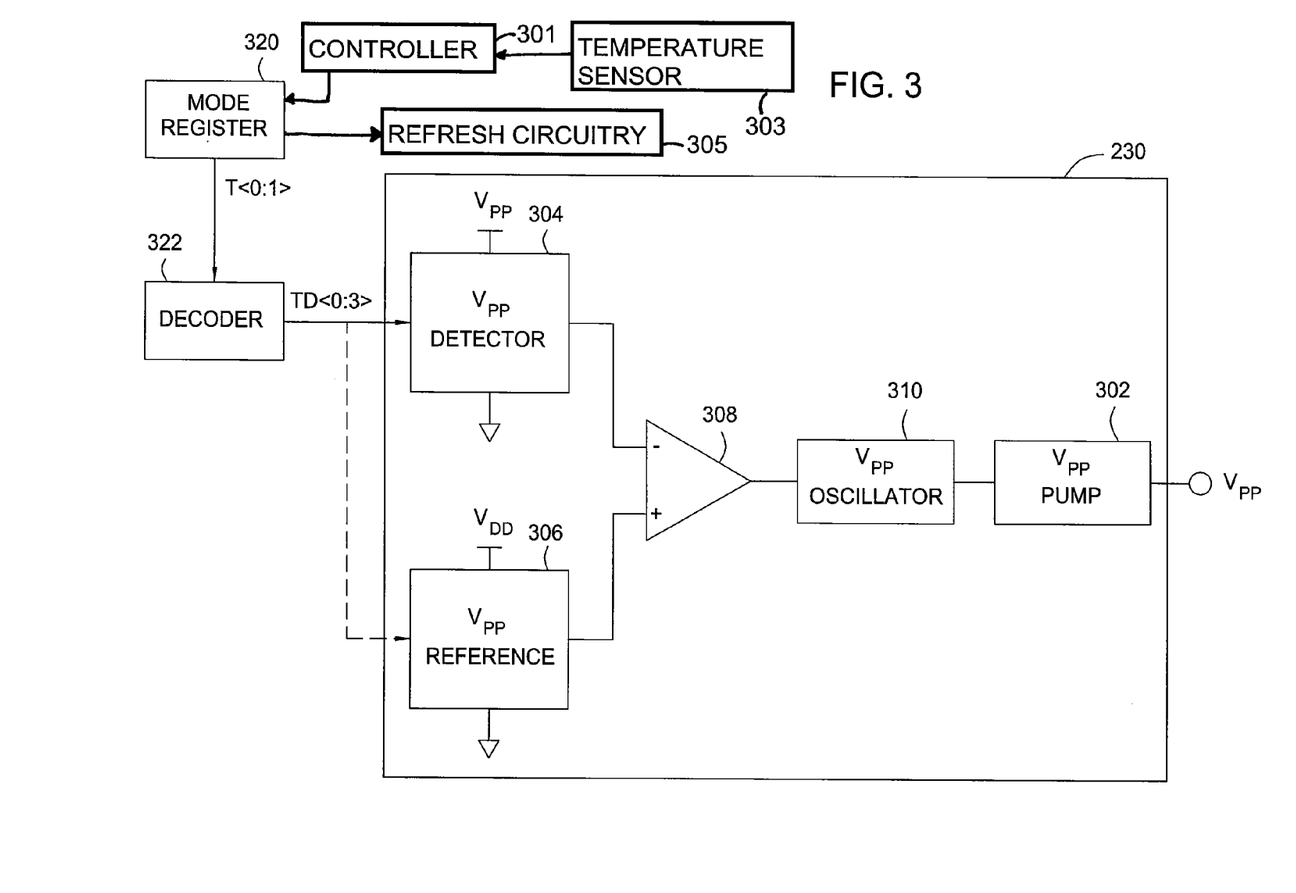
FIG. 3 illustrates an exemplary temperature controlled voltage generator in accordance with one embodiment of the present invention.

FIG. 3 illustrates one embodiment of the $V_{PP}$ voltage generator 230, that generates different voltage levels, based on the temperature control signals TD[0:3] (i.e., TD[0:N], with N=3). As illustrated, the temperature control signals TD[0:3] may be generated from two bits of temperature information T[0:1] stored in a mode register 320 input to a decoder 322 that enables (e.g., pulls high) one of the signals TD[0:3], in response to the values of T[0:1]. For some embodiments, the temperature information T[0:1] may indicate device temperature as indicated by an external temperature sensor.

For example, many portable devices utilize a temperature sensor 303 coupled with a processor or chip set. Temperature measured by this sensor 303 may be utilized in a number of different ways. For example, some low power memory devices, such as Infineon's Mobile RAM memory devices, incorporate a temperature compensated self-refresh (TCSR) 305 based on device temperature, as indicated by a mode register 320 written to by a memory controller 301 or processor. TCSR 305 adjusts the refresh rate of the memory device to the temperature of the device. In general, the lower the temperature of the device, the higher the cell threshold voltage, thus allowing lower refresh rates and corresponding power savings. For some embodiments of the present invention, the temperature information used to vary generated voltages may also be obtained from these mode registers. As will be described below, with reference to FIGS. 5 and 6, for other embodiments, temperature information may be provided by an internal temperature sensor 303 (i.e., located on-chip).

In any case, as with conventional voltage generators, the voltage generator 230, may include a charge pump 302, a $V_{PP}$ detector 304, a $V_{PP}$ reference 306, a comparator 308, and a $V_{PP}$ oscillator 310. Generally speaking, the reference 306 sets the desired $V_{PP}$ level while detector 304 is configured to detect a minimum $V_{PP}$ level. Outputs from the detector 304 and reference 306 may be input to the comparator 308 such that, when the detected $V_{PP}$ level drops below the minimum $V_{PP}$ level set by the reference 306, the output of comparator 308 enables the $V_{PP}$ oscillator 310 which drives the pump 302 to restore the original target voltage level.

Accordingly, as illustrated, the generated level of $V_{PP}$ may be varied by varying the output of the detector 304, the reference 306, or both, based on the temperature control signals TD[0:3]. For example, reducing the output of the reference 306 would cause the output of the comparator 308 to switch at a lower detected $V_{PP}$ voltage level, causing the $V_{PP}$ oscillator 310 to drive the $V_{PP}$ pump 302 for a shorter period of time, reducing the level of $V_{PP}$. Further, the $V_{PP}$ detector 304 may be configured to output a higher voltage level to the comparator 308 for a given detected $V_{PP}$, also modifying the switching point of the comparator 308 to similar effect.

Figure 4A:
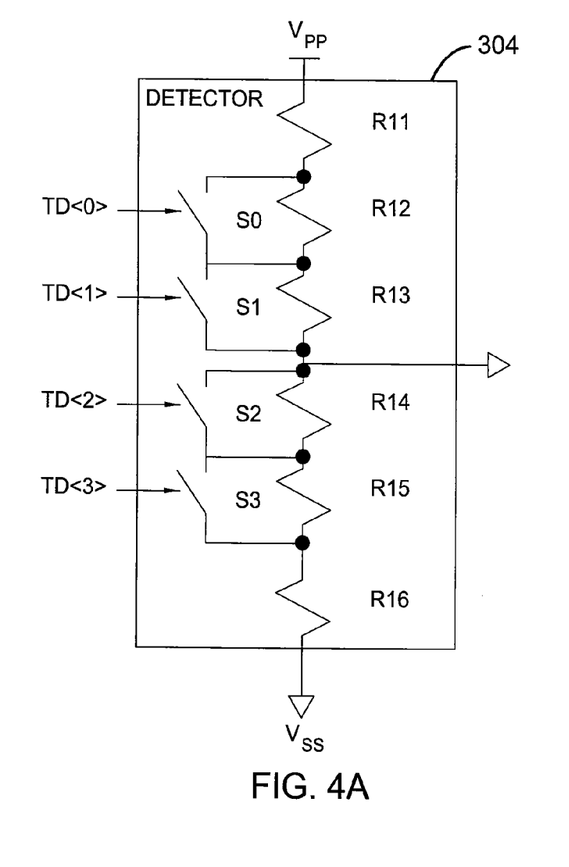
FIGS. 4A and 4B illustrate an exemplary voltage detector and voltage reference in accordance with one embodiment of the present invention.
Figure 4B:
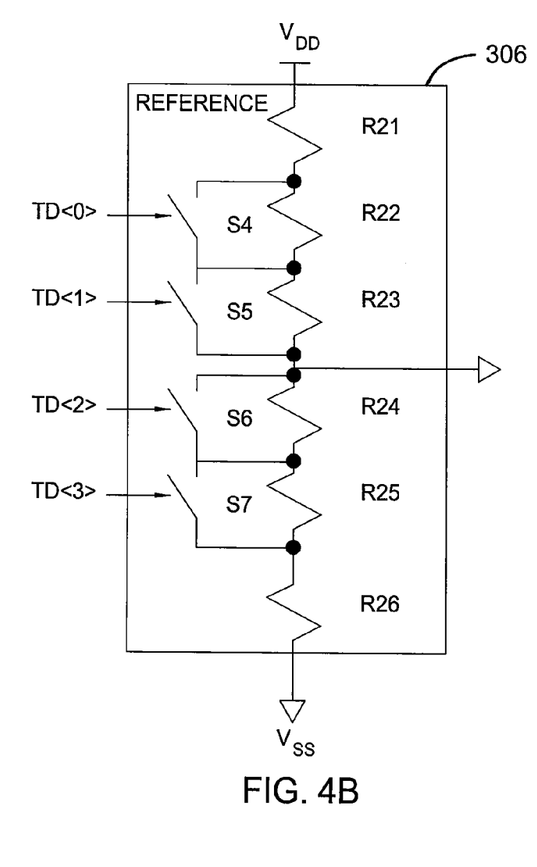

FIGS. 4A and 4B illustrate exemplary embodiments of a $V_{PP}$ detector 304 and $V_{PP}$ reference 306, respectively, which may be utilized (separately or in combination) in a $V_{PP}$ voltage generator 230 to vary its output with temperature. Of course, the illustrated circuitry is exemplary only, and those skilled in the art will recognize that various other circuit configurations may also be utilized to generate varying levels of $V_{PP}$ based on temperature to achieve the benefits described herein. Those skilled in the art will also recognize that many different types of detector and reference circuitry may be utilized and that the exact circuitry used to vary the output level of either based on temperature may vary according to the exact type of circuitry utilized.

As illustrated, the temperature controls signals TD[0:3] may be utilized in both devices to control a set of switches S0-S3 and S4-S7. The switches may operate to vary the level of each respective output voltage by selectively shunting across one or more resistors in a corresponding voltage divider network (e.g., R11-R16 for the detector 304 and R21-R26 for the reference 306). In other words, shunting across resistors above the output nodes (e.g., R12-R13 or R22-R23) effectively raises the output voltage levels, while shunting across resistors below the output nodes (e.g., R14-R15 or R24-R25) effectively lowers the output voltage levels (relative to output voltage levels achieved with all switches open).

For example, when a first temperature range is selected (as indicated by TD[0:3]=b'1000'), switch S0 of the detector 304 may be closed, adjusting the illustrated voltage divider circuit by shunting across resistors R12. Assuming the first temperature represents the highest range, shunting across the resistor R12 would have the desired effect of raising the voltage level output by the detector 304 (by eliminating the voltage drop across R12), switching off the comparator at a lower detected $V_{PP}$ level and disabling the charge pump 302 at a lower $V_{PP}$ level. The value of R13 may be chosen to be lower than R12, such that when a second temperature range is selected (as indicated by TD[0:3]=b'0100'), the switch S1 is closed, resulting in a slightly lower voltage level output by the detector 304 than for the first temperature range. Similarly, resistors R14 and R15 may be chosen to achieve incrementally lower output voltages when switches S2 and S3 are closed (in response to TD[0:3]=b'0010' and b'0001' respectively), resulting in correspondingly higher $V_{PP}$ levels at lower temperatures.

Those skilled in the art will recognize that, for some embodiments, desired variations in $V_{PP}$ may be obtained by varying the voltage output of only the $V_{PP}$ detector 304, only the $V_{PP}$ reference 306, or both. If the output voltage of both are varied, the values of resistors R11-R16 and R21-R26 may be designed to achieve complementary changes in each voltage output to achieve the desired overall change in $V_{PP}$. On the other hand, if the output voltage of only the $V_{PP}$ reference 306 is varied, the switches S4-S7 may be rearranged and the values of resistors R21-R26 may be selected to achieve a lower reference voltage for higher temperatures, resulting in a corresponding higher generated voltage level for $V_{PP}$.

In any case, those skilled in the art will recognize that the actual variations in voltage levels of $V_{PP}$ may be chosen according to the expected variations in voltage levels of cell threshold voltage for each temperature range. For example, over an operating range of 0-70° C., cell threshold voltage changes in the range of approximately +/−200 mv may be expected.

An Exemplary On-Chip Temperature Sensor

Figure 5:
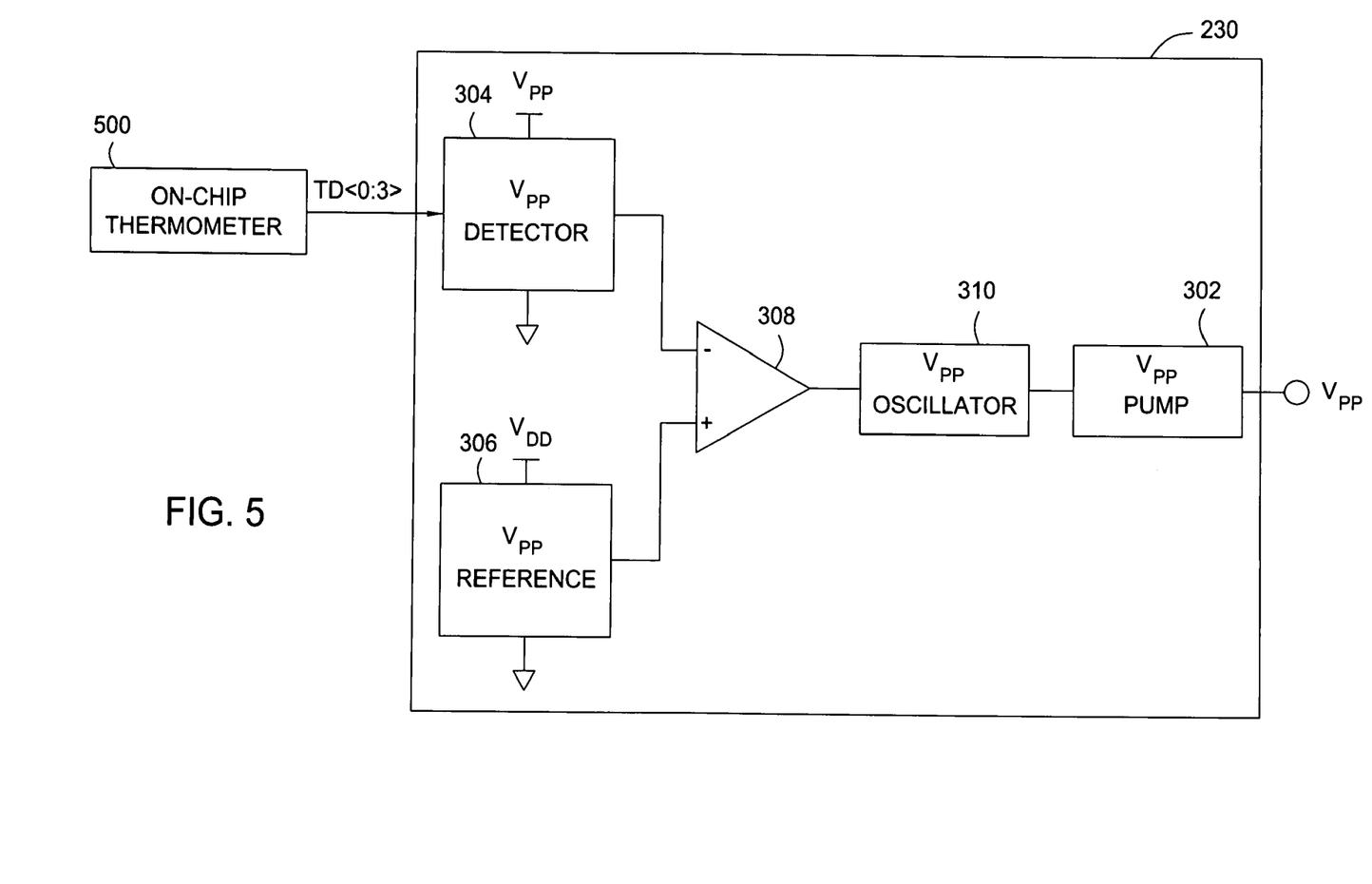
FIG. 5 illustrates an exemplary temperature controlled voltage generator responsive to a digital thermometer in accordance with one embodiment of the present invention.

As illustrated in FIG. 5, for some embodiments, temperature control signals may be generated based on temperature measurements from an on-chip digital thermometer 500 (e.g., rather than from values from an external temperature sensor written to a mode register). The digital thermometer 500 may be configured to generate temperature control signals TD[0:3], which may be used to vary the voltage level of $V_{PP}$, as described above. Accordingly, operation of the illustrated components of the $V_{PP}$ generator 230 described above need not be repeated.

Figure 6:
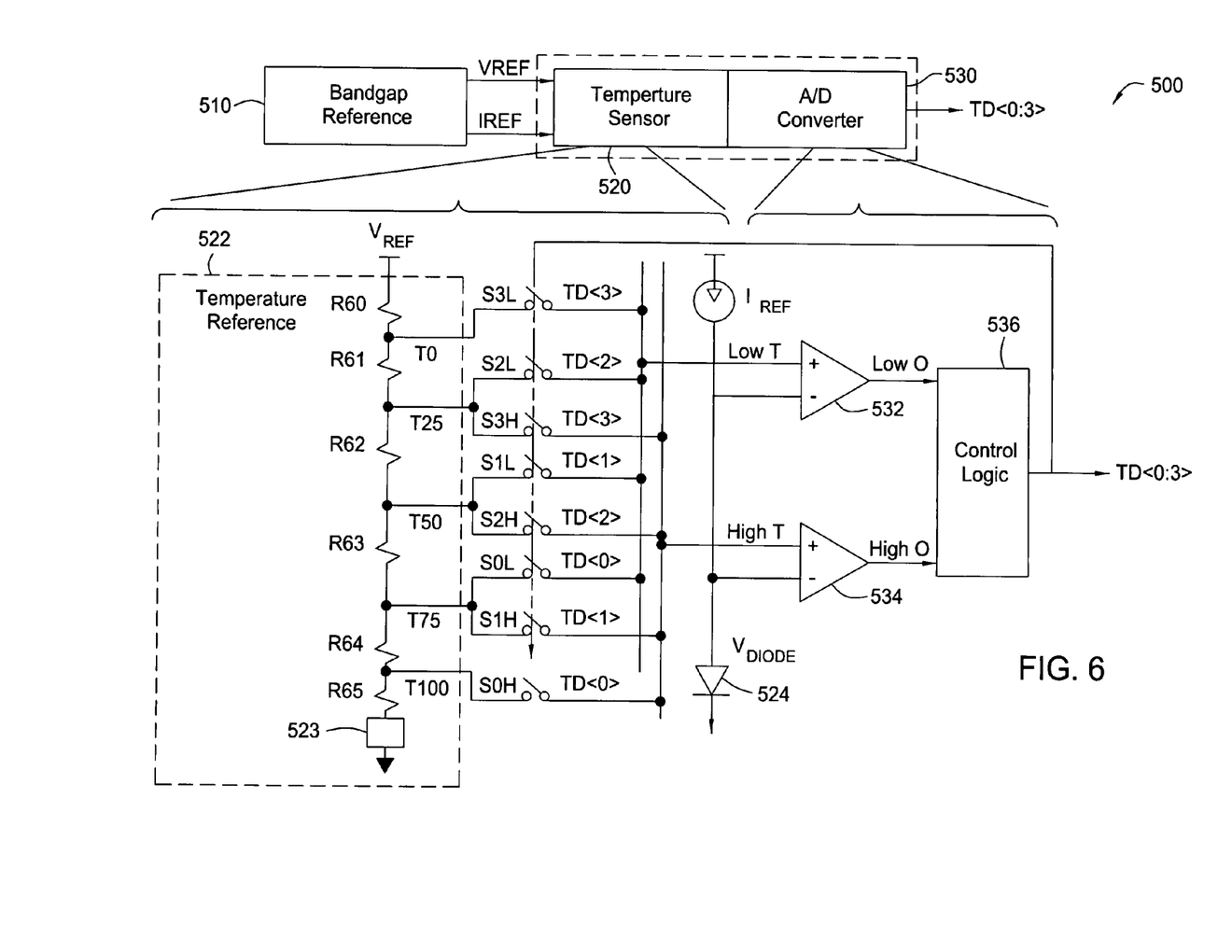
FIG. 6 illustrates an exemplary digital thermometer in accordance with one embodiment of the present invention.

The digital thermometer 500 may utilize any suitable circuitry to generate temperature control signals indicative of a current device temperature. For example, FIG. 6 illustrates one embodiment of a digital thermometer 500 utilizing a temperature sensor 520 and an analog to digital (A/D) converter 530. As illustrated, the digital thermometer 500 may be supplied with a reference voltage $V_{REF}$ by a bandgap reference 510. The bandgap reference 510 is generally designed to ensure $V_{REF}$ is independent of voltage and temperature process variations.

As illustrated, the temperature sensor 520 may include a temperature reference 522 and a diode 524, while the A/D converter 530 may include two comparators 532 and 534, and control logic 536. The temperature reference 522 provides reference voltages to the comparators 532 and 534. The voltage across the diode ($V_{DIODE}$) 524 typically decreases at a known rate (e.g., approximately 2 mV per 1° C.), and in a very linear. Once a diode with a given technology is chosen, the corresponding diode voltages at a wide range of temperatures may be readily determined. Thus, the reference voltages provided by the temperature reference 522 may be set according to the diode voltage at specific temperatures, such as each 25° C. (e.g., 0° C., 25° C., 50° C., 75° C., and 100° C.). As illustrated, these reference voltages may be set via a voltage divider network of resistors R60-R65, selected to establish nodes set to the diode voltage at each corresponding temperature (illustratively denoted T0, T25, T50, T75, and T100). The temperature reference 522 may also include a trimming circuit 523, for example, allowing for calibration of at a known temperature.

The control logic 536 may include any suitable circuitry configured to control the switching of the various nodes (T0-T100) to the comparators 532 and 534, in an effort to generate the temperature control signals TD[0:3], for example, to indicate device temperature is in a corresponding range. As illustrated, the control logic 536 may control switch pairs S0-S3 (i.e., switch pairs S0, S1, S2, and S3 are formed by discrete switches S0H and S0L, S1H and S1L, S2H and S2L, and S3H and S3L, respectively), each with a different one of the control signals control signals TD[0:3], to supply node voltages corresponding to low and high temperatures to the positive input of each of the comparators 532 and 534, respectively. The negative input of each of the comparators 532 and 534 may be coupled to the diode 524. The output of each comparator will indicate whether the ambient temperature is below or above the temperature corresponding to the node voltage. Thus, by applying different reference voltages to the comparators 532 and 534, the control logic 536 may determine if the ambient temperature is within a certain range by examining the comparator outputs.

For example, the control logic 536 may initially determine if the ambient temperature is between 75° C. and 100° C., by closing S0 (S0H and S0L) via TD[0] and opening the other switches, coupling node T100 to comparator 534 and node T75 to comparator 532. Assuming the ambient temperature is 30° C., the outputs of both comparators will be low. The control logic 536 may then close S1H and S1L (by setting TD[1]) and open the other switches, coupling node T75 to comparator 534 and node T50 to comparator 532. Again, the outputs of both comparators will be low. The control logic 536 may then close S2H and S2L (by setting TD[2]) and open the other switches, coupling node T50 to comparator 534 and node T25 to comparator 532. At this point, the output of comparator 532 will be high, while the output of comparator 534 will be low, correctly indicating the ambient temperature (assumed to be 30° C.) is in the range of 25° C. and 50° C.

The generated value of TD[0:3] may then be used by the $V_{PP}$ generator 230, as described above, to set the level of $V_{PP}$ according to the indicated temperature range. The control logic 536 may continue to maintain these values for TD[0:3], for example, while continuing to monitor the outputs of the comparators 532 and 534, to detect a change in the ambient temperature to outside the specified range. In response to detecting the ambient temperature is outside the specified range, the operations described above may be repeated, for example, changing TD[0:3] to test if the ambient temperature falls within the next highest or lowest temperature range. Of course, those skilled in the art will recognize that, rather than actually changing the temperature control signals TD[0:3] when determining the temperature range, the control logic 536 may actually change intermediate control signals that are latched once the current temperature range is determined, thus avoiding fluctuations in TD[0:3].

Exemplary Temperature Controlled $V_{BB}$ Generator

As previously described, various types of internally generated voltages other than $V_{PP}$ may also be varied with temperature to achieve various improvements in device performance. As an example, cell refresh time of a DRAM is strongly dependent on cell threshold voltage. Since cell threshold voltage is heavily dependent on temperature, as described above, cell refresh time is also heavily dependent on temperature (e.g., refresh times typically increase at higher temperatures, due to lower cell threshold voltages). For some embodiments, in an effort to raise cell threshold voltage levels and lower refresh times at higher temperatures, one or more internally generated voltages may be varied with temperature.

Figure 7:
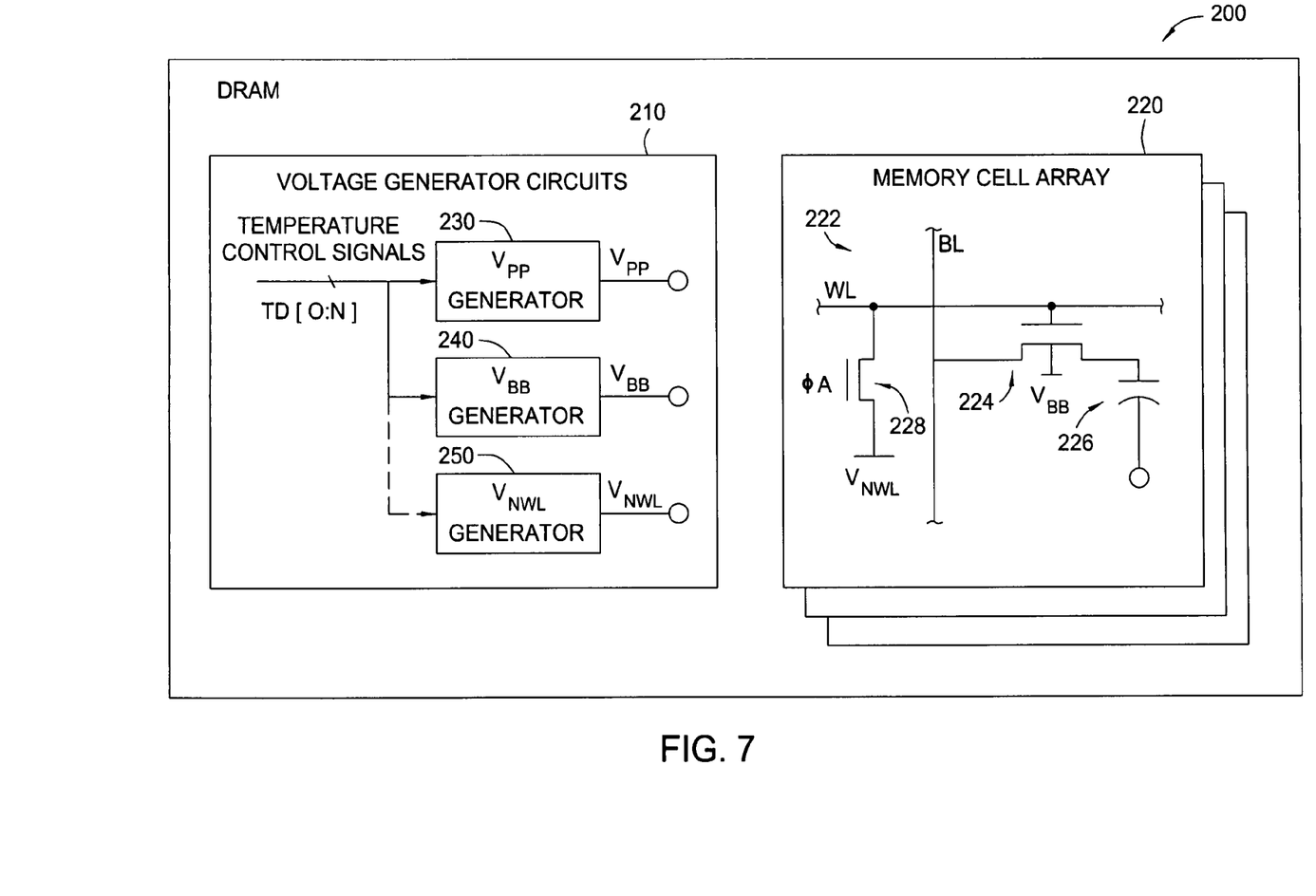
FIG. 7 illustrates an exemplary temperature controlled voltage generator in accordance with another embodiment of the present invention.

For example, as illustrated in FIG. 7, the level of an internally generated voltage used to bias the substrates of cell transistors 224 of a memory device 700, commonly referred to as back-bias voltage ($V_{BB}$), may be varied by a temperature controlled $V_{BB}$ generator 240 (which may be used separately or in conjunction with a temperature controlled $V_{BB}$ generator 230). Lowering $V_{BB}$ as temperature of the device 700 increases may improve (lower) refresh time by increasing cell threshold voltage via body effect. $V_{BB}$ is typically negative with respect to a reference ground. As such, the $V_{BB}$ generator 240 may include components similar to those of the $V_{PP}$ generator 230 described above.

Figure 8:
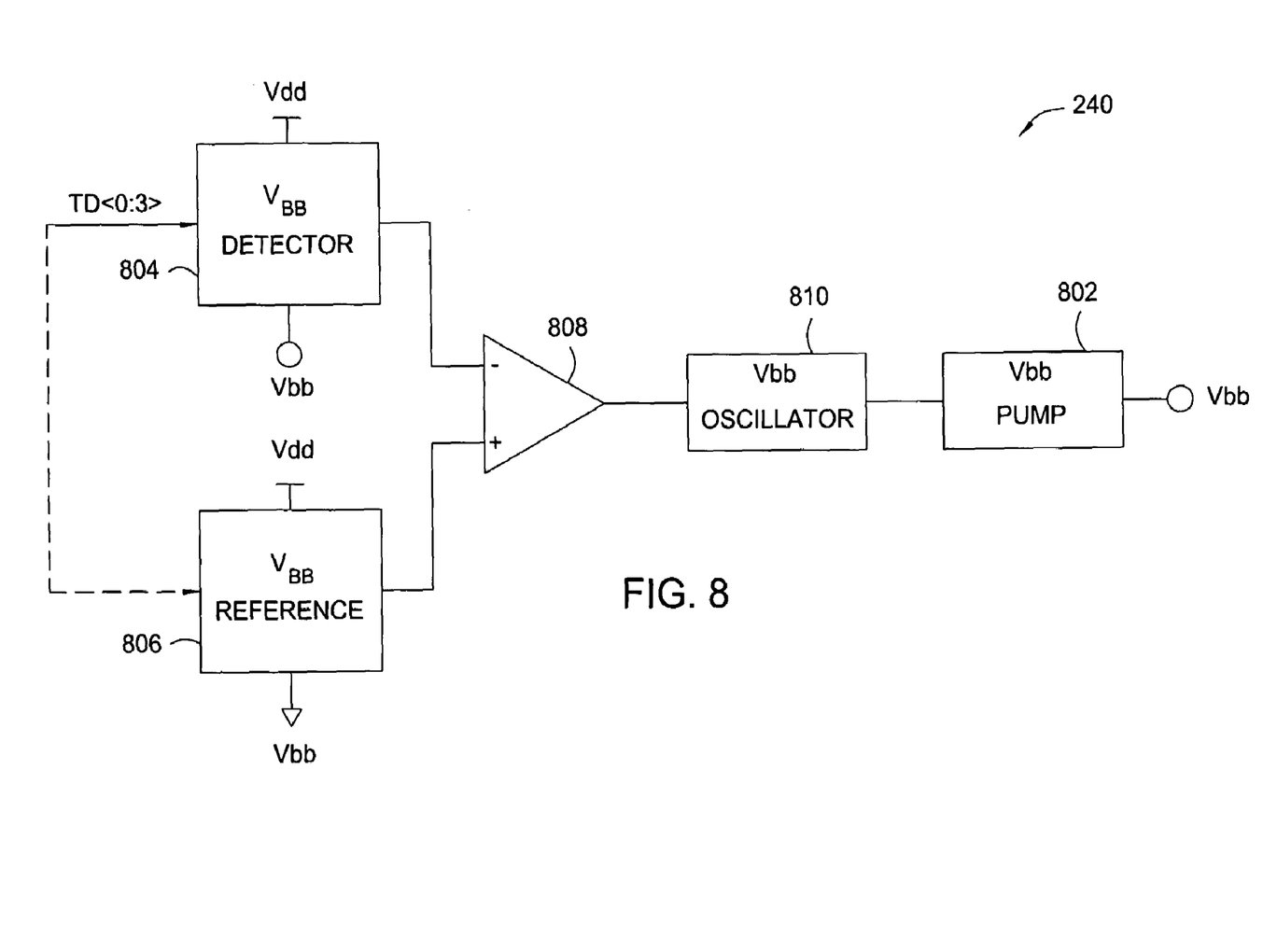
FIG. 8 illustrates an exemplary temperature controlled voltage generator in accordance with yet another embodiment of the present invention.

For example, as illustrated in FIG. 8, the $V_{BB}$ generator 240 may include a charge pump 802, a $V_{BB}$ detector 804, a $V_{BB}$ reference 806, a comparator 808, and a $V_{BB}$ oscillator 810 controlled by the output of the comparator 808. Accordingly, the level of $V_{BB}$ may be varied by varying either the $V_{BB}$ detector 804, the $V_{BB}$ reference 806, or both, as a function of temperature control signals TD[0:3]. For example, the $V_{BB}$ detector 804 and/or the $V_{BB}$ reference 806 may comprise voltage divider circuits with outputs levels varied by shunting resistors with switches controlled by TD[0:3], as described above with reference to FIGS. 4A-B. Of course, the actual variations in voltage levels of $V_{BB}$ may be chosen according to the expected variations in voltage levels of cell threshold voltage for each temperature range (e.g., +/−100 mv over 0-70° C.). The temperature control signals TD[0:3] may be generated based on temperature information provided as control bits in a mode register of the device 700 or an internal digital thermometer, as previously described.

In addition, or as an alternative, the level of a negative voltage applied to de-activated cell wordlines, commonly referred to as negative wordline voltage ($V_{NWL}$), may also be varied with device temperature, for example, via a temperature-controlled $V_{NWL}$ generator 250. $V_{NWL}$ is typically applied to wordlines via a switching transistor 228, in order to ensure cell transistors 224 connected to the wordlines are well turned off in the de-activated state, in an effort to reduce leakage current. Lowering $V_{NWL}$ as temperature of the device 700 increases may improve refresh time by increasing reversed gate-source voltage of wordlines.

As with the previously described $V_{PP}$ and $V_{BB}$ generators 230 and 240, the $V_{NWL}$ regulator 250 may also include any suitable type circuitry configured to vary $V_{NWL}$ in response to the temperature control signals TD[0:3], such as a switch-controlled voltage divider. It should be understood that, depending on a particular embodiment and the desired result, any combination of any type of temperature controlled voltage generators may be utilized.

CONCLUSION

The present invention provides methods, systems, and apparatus for reducing varying the levels of one or more internally generated voltages, such as $V_{PP}$, $V_{BB}$, and/or $V_{NWL}$, based on externally supplied or internally generated temperature information. By varying such internally generated voltages based on temperature information, improvements in device performance may be achieved. As an example, by decreasing $V_{PP}$ with increasing temperature, subthreshold leakage current may be reduced. As another example, by lowering $V_{BB}$ and/or $V_{NWL}$ with increasing temperature, cell threshold voltage may be increased which may improve refresh time. Of course, those skilled in the art will recognize that other improvements in device performance may also be achieved by varying these, as well as other internally generated voltages, for example, supplied to various peripheral circuitry, utilizing the techniques described herein.

While the foregoing is directed to embodiments of the present invention, other and further embodiments of the invention may be devised without departing from the basic scope thereof, and the scope thereof is determined by the claims that follow.

What is claimed is:

1. A method of generating one or more voltages internally by a memory device, comprising:

obtaining temperature information indicative of the temperature of the memory device, wherein obtaining temperature information comprises reading one or more bits in a mode register;

varying a level of one or more internally generated voltages based on the temperature information, comprising decreasing the level of the one or more internally generated voltages as device temperature increases; and applying the one or more internally generated voltages to an array of memory cells of the memory device.

2. The method of claim 1, wherein a refresh rate of the memory device is also varied based on the one or more bits.

3. The method of claim 1, wherein varying the level of one or more internally generated voltages based on the temperature information comprises:

generating one or more control signals based on the temperature information; and adjusting, based on the one or more control signals, at least one of an output voltage level of a detector or an output voltage level of a reference, wherein both the detector and the reference are part of a voltage generator.

4. The method of claim 3, comprising adjusting the output voltage level of both the detector and the reference.

5. The method of claim 3, wherein adjusting at least one of an output voltage level of a detector or an output voltage level of a reference comprises controlling one or more switches with the one or more control signals.

6. The method of claim 3, wherein adjusting at least one of an output voltage level of a detector or an output voltage level of a reference comprises modifying the output voltage of a voltage divider circuit by closing a switch shunting a resistor.

7. The method of claim 3, wherein each of the one or more control signals corresponds to a distinct temperature range and generating the one or more control signals comprises:

determining a distinct temperature range including the ambient temperature; and setting the control signal corresponding to the distinct temperature range including the ambient temperature.

8. The method of claim 1, wherein at least one of the internally generated voltages is negative with respect to a ground reference.

9. A method of reducing subthreshold current in memory cells of a memory device, comprising:

generating, from a supply voltage, a boosted voltage greater than the supply voltage to be applied to a wordline of one or more of the memory cells during a memory cell access; and varying the level of the boosted voltage based on temperature information indicative of a temperature of the memory device, comprising decreasing the level of the boosted voltage as device temperature increases, wherein the temperature information is written to a mode register of the memory device by an external device.

10. The method of claim 9, wherein varying the level of the boosted voltage based on temperature information comprises adjusting the output level of at least one of a voltage detector and a voltage reference based on the temperature information.

11. The method of claim 10, wherein varying the level of the boosted voltage based on temperature information comprises increasing the output level of the voltage detector as device temperature increases.

12. The method of claim 10, wherein increasing the output level of the voltage detector comprises shunting a resistor of a voltage divider circuit.

13. The method of claim 9, wherein a refresh rate of the memory device is also varied based on the temperature information.

14. The method of claim 9, wherein the temperature information is generated by a temperature sensing component internal to the memory device.

15. The method of claim 9, further comprising generating a plurality of temperature control signals based on the temperature information, wherein each temperature control signal corresponds to a distinct temperature range.

16. The method of claim 15, wherein generating a plurality of temperature control signals comprises determining if a diode voltage is within one of a plurality of distinct voltage ranges associated with the distinct temperature ranges.

17. A memory device comprising:
peripheral circuitry;
a plurality of memory cells;
means for supplying temperature information indicative of a temperature of the memory device; and
a voltage generator configured to generate, from a supply voltage, a boosted voltage greater than the supply voltage and vary the level of the boosted voltage based on the temperature information, wherein the voltage generator is configured to decrease the level of the boosted voltage as the temperature of the memory device increases, as indicated by the temperature information.

18. The memory device of claim 17, wherein the boosted supply voltage is applied to a wordline of one or more of the memory cells during a memory cell access.

19. The memory device of claim 17, wherein the voltage generator varies the level of the boosted voltage in response to a plurality of temperature control signals generated based on the temperature information.

20. The memory device of claim 19, wherein:
distinct logic states of the control signals corresponds to distinct temperature ranges; and
the voltage generator is configured to adjust the boosted voltage to a different level for each distinct temperature range.

21. The memory device of claim 20, wherein:
the voltage generator comprises a voltage detector and a voltage reference; and
the voltage generator is configured to vary the level of the boosted voltage by varying an output voltage of at least one of the voltage detector and the voltage reference.

* * * * *